(12) United States Patent
Yamada et al.

(10) Patent No.: US 8,456,184 B2
(45) Date of Patent: Jun. 4, 2013

(54) PROBE CARD FOR A SEMICONDUCTOR WAFER

(75) Inventors: Yoshio Yamada, Nagano (JP); Hiroshi Nakayama, Nagano (JP); Mitsuhiro Nagaya, Nagano (JP); Tsuyoshi Inuma, Nagano (JP); Takashi Akao, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 150 days.

(21) Appl. No.: 12/450,145

(22) PCT Filed: Mar. 12, 2008

(86) PCT No.: PCT/JP2008/054498
§ 371 (c)(1),
(2), (4) Date: Mar. 4, 2010

(87) PCT Pub. No.: WO2008/126601
PCT Pub. Date: Oct. 23, 2008

(65) Prior Publication Data
US 2010/0164518 A1    Jul. 1, 2010

(30) Foreign Application Priority Data
Mar. 14, 2007    (JP) .................. 2007-065651

(51) Int. Cl.
G01R 31/20    (2006.01)
G01R 31/00    (2006.01)

(52) U.S. Cl.
USPC ............. 324/754.11; 324/754.14; 324/754.18

(58) Field of Classification Search
USPC .. 324/756.03, 754.01–754.14, 754.18–754.2, 324/756.01–756.07
See application file for complete search history.

(56) References Cited

U.S. PATENT DOCUMENTS 6,292,003 B1 *  9/2001  Fredrickson et al. ..... 324/750.25
6,297,652 B1 * 10/2001  Shimoda et al. ......... 324/755.08
(Continued)

FOREIGN PATENT DOCUMENTS

JP    2005-164601    6/2005
JP    2006-23271    1/2006
(Continued)

OTHER PUBLICATIONS

International Search Report and Written Opinion issued in PCT/JP2008/054498 dated Jun. 24, 2008.
(Continued)

*Primary Examiner* — Joshua Benitez Rosario
(74) *Attorney, Agent, or Firm* — Edwards Wildman Palmer LLP

(57) ABSTRACT

A probe card is provided that is capable of accurately ensuring the flatness and the parallelism with respect to a predetermined reference surface. A point (Q) of application of force applied from a leaf spring (17) that presses a portion near an edge portion of a surface of a probe head (15) from which a plurality of probes projects over an entire circumference in a direction of a substrate to the probe head (15) is positioned inside of an outer edge of the probe head (15), and a point (P) of application of force applied from the retainer (16) that presses a portion near an edge portion of a space transformer (14) over an entire circumference in the direction of the substrate to the space transformer (14) is positioned inside of an outer edge of the space transformer (14).

13 Claims, 13 Drawing Sheets

U.S. PATENT DOCUMENTS

| | | | |
|---|---|---|---|
| 6,509,751 B1* | 1/2003 | Mathieu et al. | 324/750.25 |
| 6,586,956 B2* | 7/2003 | Aldaz et al. | 324/750.16 |
| 7,038,471 B2* | 5/2006 | Kimura et al. | 324/691 |
| 7,049,837 B2* | 5/2006 | Kasukabe et al. | 324/754.07 |
| 7,071,715 B2* | 7/2006 | Shinde et al. | 324/756.03 |
| 7,255,575 B2* | 8/2007 | Hasegawa | 439/71 |
| 7,285,968 B2* | 10/2007 | Eldridge et al. | 324/750.03 |
| 7,759,952 B2* | 7/2010 | Garabedian et al. | 29/755 |
| 7,795,892 B2* | 9/2010 | Yamada et al. | 324/756.03 |
| 7,893,704 B2* | 2/2011 | Gleason et al. | 324/755.01 |
| 7,898,272 B2* | 3/2011 | Sasaki et al. | 324/756.03 |
| 8,049,525 B2* | 11/2011 | Yamada et al. | 324/754.11 |
| 8,058,889 B2* | 11/2011 | Williams | 324/756.03 |
| 2006/0003625 A1 | 1/2006 | Yoon | |
| 2006/0006889 A1* | 1/2006 | Smith et al. | 324/754 |
| 2006/0240581 A1 | 10/2006 | Suzuki et al. | |
| 2009/0167335 A1* | 7/2009 | Yamada et al. | 324/758 |
| 2010/0001752 A1* | 1/2010 | Yamada et al. | 324/758 |
| 2010/0052707 A1* | 3/2010 | Nakayama et al. | 324/754 |
| 2010/0219852 A1* | 9/2010 | Yamada et al. | 324/754 |

FOREIGN PATENT DOCUMENTS

| | | |
|---|---|---|
| JP | 2006-300733 | 11/2006 |
| JP | 2007-003334 | 1/2007 |
| JP | 2007-057438 | 3/2007 |
| TW | 588400 B | 5/2004 |
| WO | WO-2006/114885 | 11/2006 |
| WO | WO-2006/126279 | 11/2006 |
| WO | WO-2007/066622 | 6/2007 |

OTHER PUBLICATIONS

Office Action for Taiwanese Patent Application No. 097108991 dated Feb. 7, 2012 (English Translation).

* cited by examiner

PROBE CARD FOR A SEMICONDUCTOR WAFER

TECHNICAL FIELD

The present invention relates to a probe card that electrically connects a semiconductor wafer as a test object and a circuit structure that generates a signal for a test.

BACKGROUND ART

In a semiconductor test process, a wafer level test for detecting a defective product is sometimes performed by performing a conductivity test by bringing probes having conductivity (conductive probes) into contact with a semiconductor wafer before dicing. When the wafer level test is performed, to transfer a signal for a test generated and sent by a testing device (tester) to the semiconductor wafer, a probe card housing a large number of probes is used. In the wafer level test, the probes are individually brought into contact with each of dies on the semiconductor wafer while the dies are scanned by the probe card. However, because hundreds to tens of thousands of dies are formed on the semiconductor wafer, it takes considerable time to test one semiconductor wafer. Thus, an increase in the number of dies causes higher cost.

To solve the problems of the wafer level test, in recent years, a method called full wafer level test is also used in which hundreds to tens of thousands of probes are collectively brought into contact with all or at least about ¼ to ½ of dies on a semiconductor wafer. To accurately bring the probes into contact with the semiconductor wafer, this method requires a technology for accurately keeping the parallelism or the flatness of a probe card with respect to a predetermined reference surface. For example, Patent Document 1 described below discloses a technology related to a clamp frame that presses an edge portion of a space transformer that spatially widens the interval of fine wires of probes as part of a mechanism for flattening a wiring substrate.

Patent Document 1: Japanese Patent Application Laid-open No. 2005-164601 (FIG. 1)

DISCLOSURE OF INVENTION

Problem to be Solved by the Invention

However, in the conventional probe card for the full wafer level test described above, a reaction force of a resilient member such as a plate spring composing an interposer interposed between a space transformer and a wiring substrate acts to a clamp frame via a contact point of the edge portion of the space transformer, and therefore the clamp frame is substantially rotationally supported at the contact point, so that a problem arises in that the clamp frame warps in a direction opposite to a direction in which the clamp frame presses the space transformer. Consequently, the space transformer itself warps, so that the parallelism and the flatness cannot be accurately ensured with respect to a predetermined reference surface.

The present invention has been made in view of the above, and it is an object of the present invention to provide a probe card capable of accurately ensuring the parallelism and the flatness with respect to a predetermined reference surface.

Means for Solving Problem

A probe card according to an aspect of the present invention is a probe card that electrically connects a semiconductor wafer as a test object and a circuit structure that generates a signal for a test, and includes a plurality of probes that is made of a conductive material and comes into contact with the semiconductor wafer to receive or output an electric signal; a probe head that houses and holds the probes; a substrate that includes wires electrically connected to the circuit structure; a space transformer that transforms intervals between the wires of the substrate and causes the wires to come out to a surface of the space transformer on a side opposing the probe head; and a holding unit that holds the probe head and the space transformer by pressing a portion near an edge portion of each of the probe head and the space transformer in a direction of the substrate, wherein a point of application of force applied from the holding unit to the probe head is positioned inside of an outer edge of the probe head and/or a point of application of force applied from the holding unit to the space transformer is positioned inside of an outer edge of the space transformer.

In the probe card, the holding unit may include a retainer that presses a portion near an edge portion of a surface of the space transformer in the direction of the substrate, and a point of application of force applied from the retainer to the space transformer may be positioned inside of the outer edge of the space transformer.

In the probe card, the retainer may include a main body that includes a hollow portion in which the space transformer is housed, and a contact portion that extends in a belt shape in an inner circumference direction from an end surface of the main body and is in contact with the space transformer, and the contact portion may be formed by cutting out a surface of a base end portion on a side on which the contact portion is in contact with the space transformer in a groove shape.

In the probe card, a plurality of post members that is embedded to be pierced through the substrate from a surface of the substrate and has a height higher than a thickness of the substrate may be further included, wherein at least part of the post members is arranged at a position opposing the contact portion in a thickness direction of the space transformer.

In the probe card, the retainer may include a main body that includes a hollow portion in which the space transformer is housed, and a ring member that is attached to an end surface of the main body, has a ring shape extending in a belt shape in an inner circumference direction from an inner edge of the main body, and is in contact with the space transformer, wherein the ring member includes a contact portion at an inner edge portion extending in the belt shape, which projects in a direction perpendicular to a plane surface formed by the ring and is in contact with the space transformer on an inside of the outer edge of the space transformer.

In the probe card, a plurality of post members that is embedded to be pierced through the substrate from a surface of the substrate and has a height higher than a thickness of the substrate may be further included, wherein at least part of the post members is arranged at a position opposing the contact portion in a thickness direction of the space transformer.

In the probe card, an edge portion of a surface opposing the retainer out of surfaces of the space transformer may be chamfered.

In the probe card, the holding unit may include a leaf spring that presses a portion near an edge portion of a surface of the probe head in the direction of the substrate, and a point of application of force applied from the leaf spring to the probe head may be positioned inside of the outer edge of the probe head.

In the probe card, an edge portion of a surface opposing the leaf spring out of surfaces of the probe head may be chamfered.

In the probe card, a reinforcing member that is mounted on the substrate and reinforces the substrate may be further included, wherein the holding unit may include a screw member that fastens the space transformer, the substrate, and the reinforcing member.

In the probe card, the holding unit may further include a retainer that presses a portion near an edge portion of a surface of the space transformer in the direction of the substrate, and the screw member may fasten the retainer together with the space transformer, the substrate, and the reinforcing member.

In the probe card, the holding unit may include a second screw member that fastens the probe head and the space transformer.

In the probe card, an interposer that is stacked between the substrate and the space transformer and connects the wires of the substrate may be further included.

Effect of the Invention

A probe card according to the present invention can suppress warp of the probe head and the space transformer by positioning a point of application of force applied from the holding unit to the probe head inside of the outer edge of the probe head and/or positioning a point of application of force applied from the holding unit to the space transformer inside of the outer edge of the space transformer. Thus, the parallelism and the flatness can be accurately ensured with respect to a predetermined reference surface.

Figure 1:
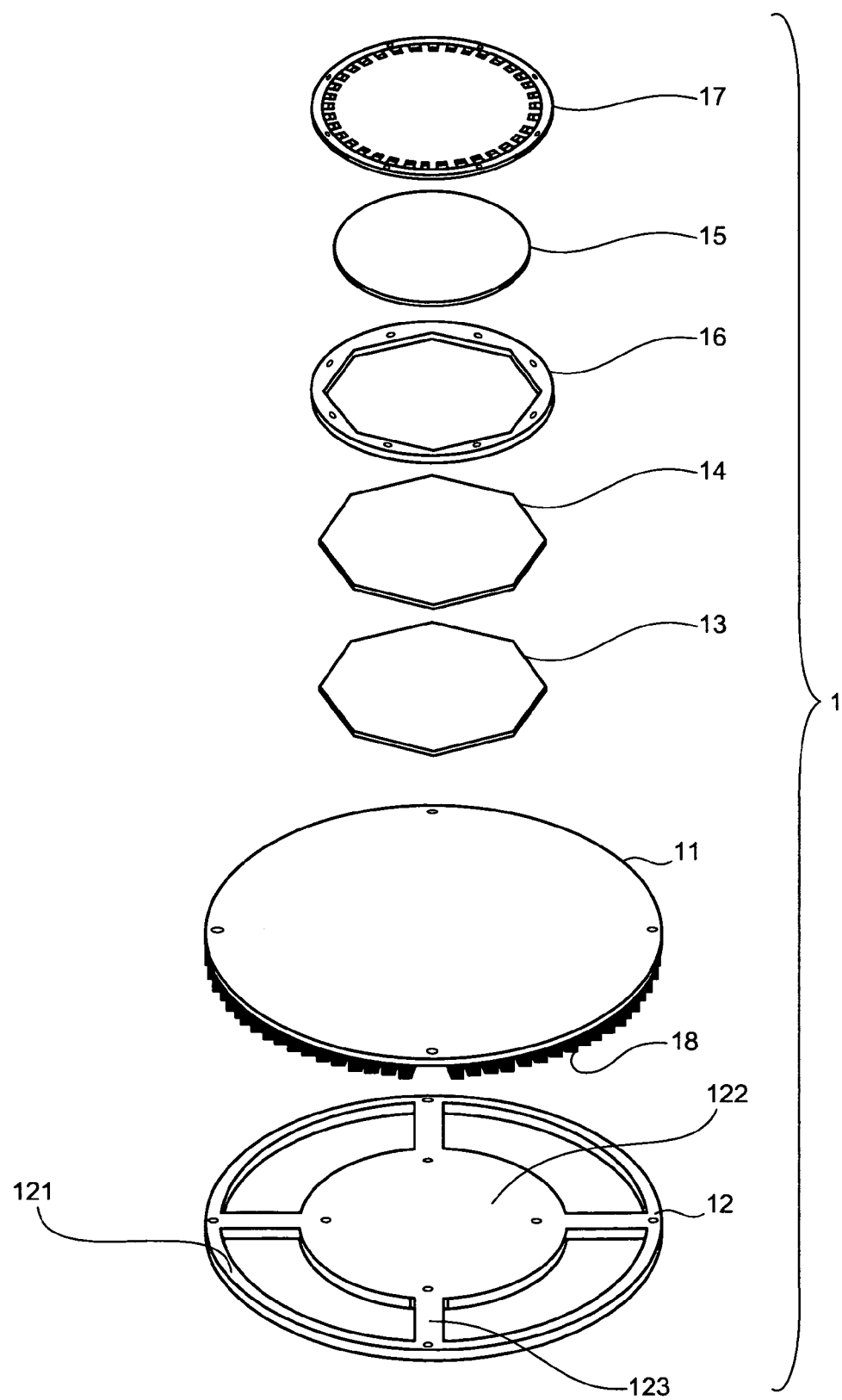
FIG. 1 is an exploded perspective view of a structure of a relevant part of a probe card according to a first embodiment of the present invention.

EXPLANATIONS OF LETTERS OR NUMERALS 1, 4, 5, 6, 7, 8, 9 probe card
2 probe
3 semiconductor wafer
11, 51, 71 substrate
12, 52, 72 reinforcing member
13, 53, 73, 83 interposer
14, 64, 74, 84 space transformer
15, 65, 75 probe head
15$p$ probe housing area
16, 66, 76, 85 retainer
17, 19, 67 leaf spring
18 connector
21, 22, 133, 134 needle-like member
21$a$, 22$a$, 133$a$, 134$a$ needle-like portion
21$b$, 22$c$, 133$c$, 134$c$ boss portion
21$c$ shaft portion
22$b$, 133$b$, 134$b$ flange portion
23, 135 spring member
23$a$, 135$a$ loosely wound portion
23$b$, 135$b$ tightly wound portion
31, 111, 141 electrode pad
54 post member
54$a$ large diameter portion
54$b$ small diameter portion
86, 161, 661, 761 main body
87, 91, 92 ring member
101, 102, 103, 104, 105, 106 screw member
121, 171, 191, 521, 671, 721 outer peripheral portion
122, 522, 722 central portion
123, 523 coupling portion
131 housing
131$a$ first member
131$b$ second member
132 connection terminal
136, 137, 151, 511, 524, 531, 711, 724, 731, 732, 741, 742, 751, 763, 831, 841, 911, 921 hole portion
151$a$ large diameter hole
151$b$ small diameter hole
162, 662, 762, 871 contact portion
162$a$ thin portion
172, 192, 672 pawl portion
541 hollow portion
641, 651 chamfered portion

BEST MODE(S) FOR CARRYING OUT THE INVENTION

Best modes for carrying out the present invention (hereinafter, "embodiments") are explained below with reference to the accompanying drawings. It should be noted that the drawings are schematic and a relation between the thickness and width of each portion, a ratio of the thicknesses of the respective portions, and the like may be different from realistic ones. It goes without saying that, the drawings may depict some portion as having different relations and ratios of dimensions.

First Embodiment

Figure 2:
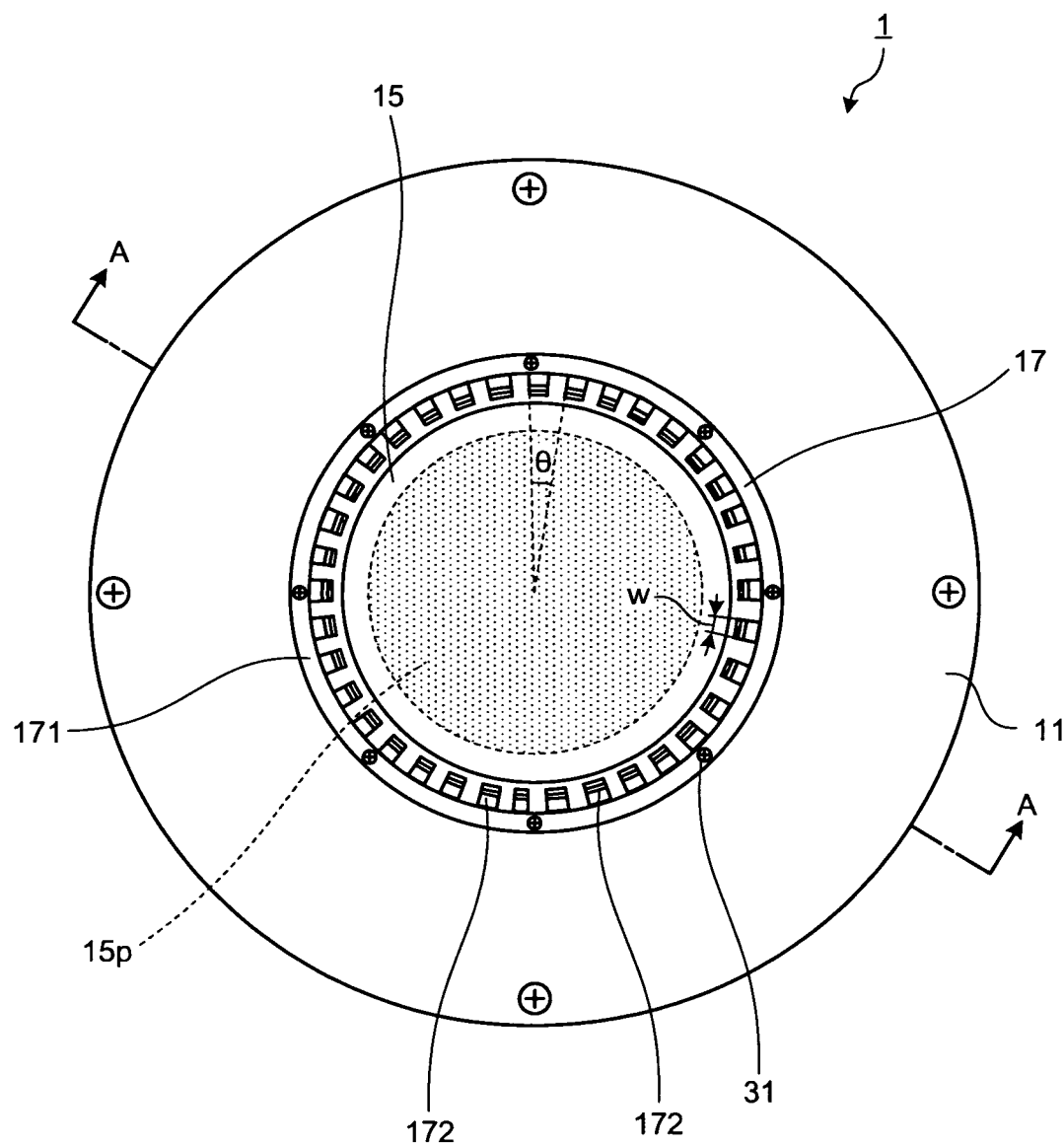
FIG. 2 is a plan view of a structure of the probe card according to the first embodiment of the present invention.
Figure 3:
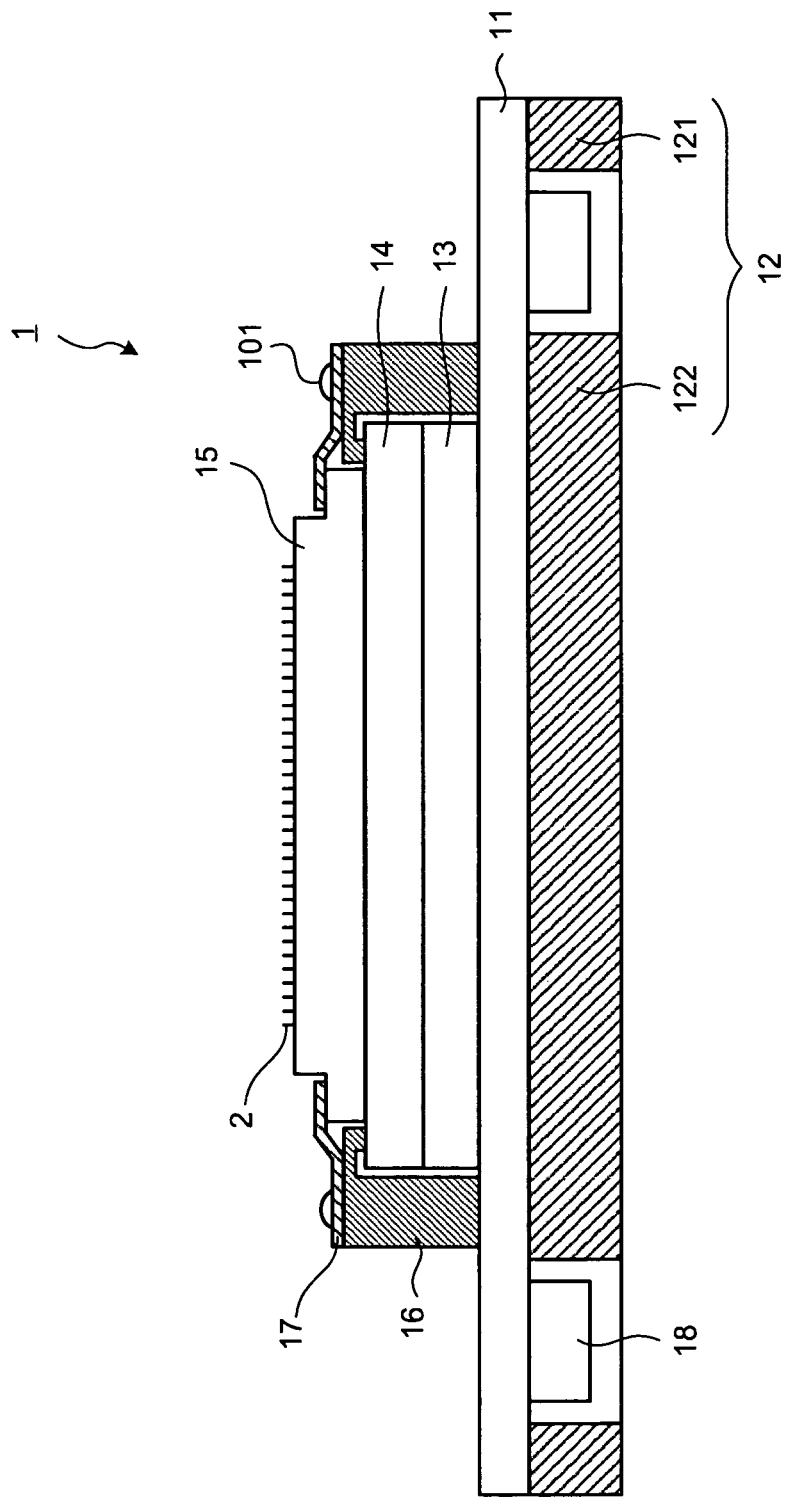
FIG. 3 is a cross sectional view of the relevant part taken along line A-A in FIG. 2.

FIG. 1 is an exploded perspective view of a structure of a relevant part of a probe card according to a first embodiment of the present invention. FIG. 2 is a plan view of the probe card according to the first embodiment when viewed from the top in FIG. 1. FIG. 3 is a relevant part cross sectional view taken along line A-A in FIG. 2. A probe card 1 shown in FIGS. 1 to 3 electrically connects, using a plurality of probes, a semiconductor wafer as a test object and a testing device including a circuit structure that generates a signal for a test.

The probe card 1 includes a substrate 11 that is formed in a disc shape and realizes electrical connection with the testing device, a reinforcing member 12 that is mounted on one side of the substrate 11 and reinforces the substrate 11, an interposer 13 for connection of wires from the substrate 11, which has a regular octagonal surface and is formed in a thin plate shape, a space transformer 14 that transforms intervals between the wires connected through the interposer 13, and a probe head 15 that is formed in a disc shape having a diameter smaller than that of the substrate 11, stacked on the space transformer 14, and houses and holds a plurality of probes corresponding to a wiring pattern of the test object. The probe card 1 also includes a retainer 16 that is fixed to the substrate 11 and collectively holds the interposer 13 and the space transformer 14 in a stacked state, a leaf spring 17 that is fixed to the retainer 16 and holds the probe head 15, and connectors 18 that are connected to one ends of the wires formed on the substrate 11.

The more detailed structure of the probe card 1 is explained below. The substrate 11 is formed by using an insulative material such as Bakelite or epoxy resin. In the substrate 11, a wiring layer (wiring pattern) for electrically connecting the probes and the testing device is three-dimensionally formed by via-holes and the like.

The reinforcing member 12 includes a circular outer peripheral portion 121 that has substantially the same diameter as the substrate 11, a central portion 122 that has the center the same as that of a circle formed by the outer peripheral portion 121 and is formed in a disc shape, and a plurality of coupling portions 123 (four in FIG. 1) that extend from an outer peripheral direction of the central portion 122 to reach the outer peripheral portion 121 and couple the outer peripheral portion 121 and the central portion 122. The reinforcing member 12 is realized by a material of high hardness such as alumite-finished aluminum, stainless steel, an invar material, a Kovar material (registered trademark), or duralumin.

Figure 4:
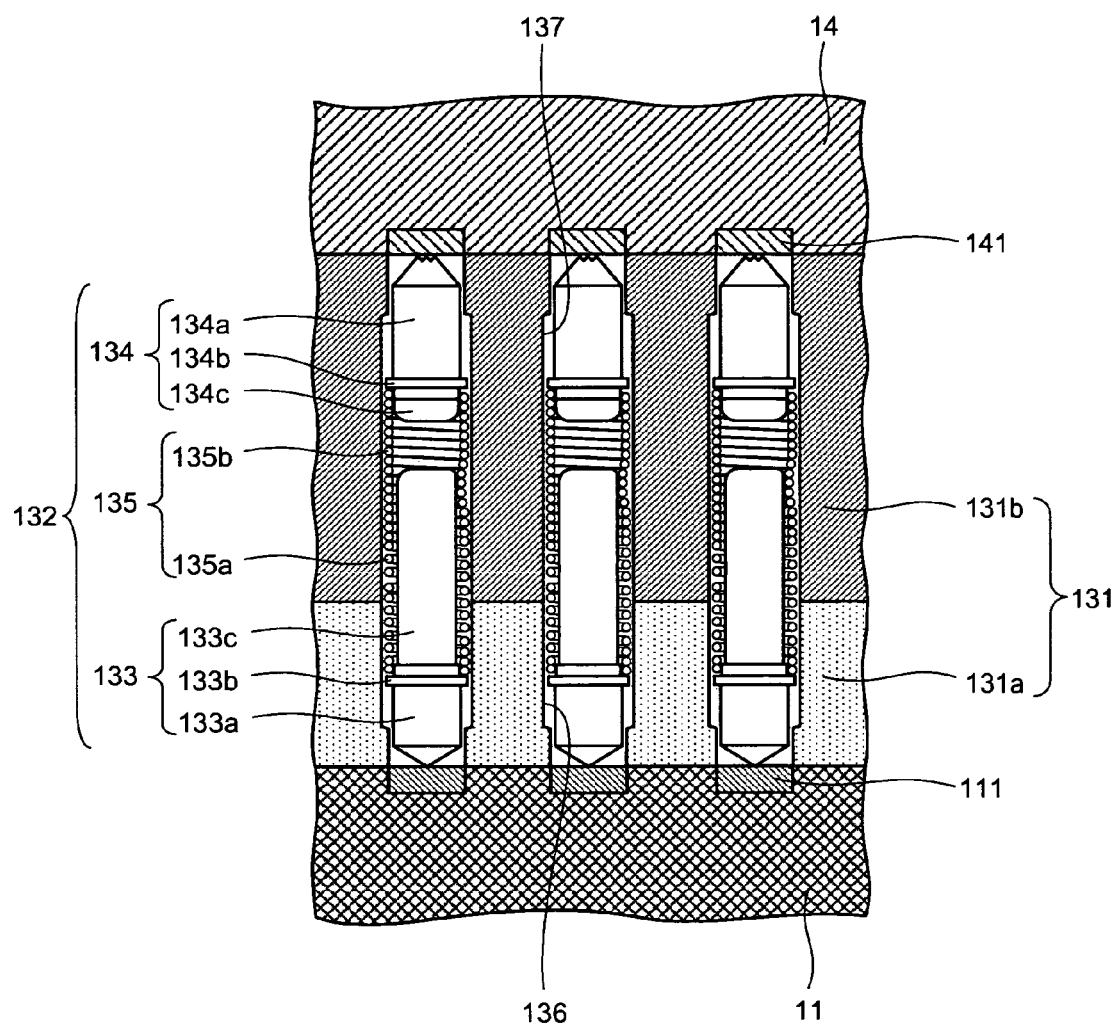
FIG. 4 is a partial cross sectional view of an internal structure of an interposer included in the probe card according to the first embodiment of the present invention.

FIG. 4 is a partial cross sectional view of a detailed internal structure of the interposer 13. The interposer 13 is formed by housing and holding a plurality of connection terminals 132 in a housing 131. The connection terminal 132 includes a needle-like member 133 that comes into contact with the substrate 11, a needle-like member 134 that comes into contact with the space transformer 14, and a spring member 135 that is provided between the needle-like member 133 and the needle-like member 134 and couples the two kinds of the needle-like members 133 and 134.

The needle-like member 133 includes a needle-like portion 133a that has a sharp tip projecting in a tip direction, a flange portion 133b that is provided at a base end portion on the opposite side of the tip of the needle-like portion 133a and has a diameter larger than a diameter of the needle-like portion 133a, and a boss portion 133c that projects from a surface on the opposite side of the side of the flange portion 133b in contact with the needle-like portion 133a and has a diameter smaller than a diameter of the flange portion 133b. The tip of the needle-like member 133 is in contact with an electrode pad 111 of the substrate 11.

The needle-like member 134 includes a needle-like portion 134a having a tip in a crown shape from which a plurality of pawls project, a flange portion 134b that is provided at a base end portion on the opposite side of the tip of the needle-like portion 134a and has a diameter larger than a diameter of the needle-like portion 134a, and a boss portion 134c that projects from a surface on the opposite side of the side of the flange portion 134b in contact with the needle-like portion 134a and has a diameter smaller than a diameter of the flange portion 134b. The tip of the needle-like member 134 is in contact with an electrode pad 141 of the space transformer 14. The diameter of the flange portion 134b is the same as that of the flange portion 133b. The diameter of the boss portion 134c is the same as that of the boss portion 133c.

A member having the same shape as the needle-like member 133 can be employed as the needle-like member 134. A member having the same shape as the needle-like member 134 can be employed as the needle-like member 133.

The needle-like member 133 side of the spring member 135 is a loosely wound portion 135a, while the needle-like member 134 side thereof is a tightly wound portion 135b. The end portion of the loosely wound portion 135a is wound around the boss portion 133c. The end portion of the tightly wound portion 135b is wound around the boss portion 134c. The loosely wound portion 135a and the flange portion 133b are joined and the tightly wound portion 135b and the flange portion 134b are joined by any one of a spring winding force and soldering or both.

A part of the tightly wound portion 135b is in contact with the boss portion 133c of the needle-like member 133. Therefore, a linear electric signal along an axial direction of the connection terminal 132 flows to the tightly wound portion 135b, and an electric signal does not flow in a coil shape to the loosely wound portion 135a. Consequently, an increase in the inductance of the connection terminal 132 can be controlled.

The housing 131 that houses the connection terminals 132 is formed by superimposing a first member 131a and a second member 131b one on top of the other. Stepped-hole-shaped hole portions 136 that individually house the connection terminals 132 are formed in the first member 131a. Stepped-hole-shaped hole portions 137 that individually house the connection terminals 132 are formed in the second member 131b. The hole portions 136 and 137 are formed in stepped hole shapes, so that the connection terminals 132 are prevented from coming off.

In the interposer 13 having the above structure, the connection terminals 132 including the coil springs are applied. Therefore, the connection terminals 132 elongate and contract in the axis direction independently from one another and it is possible to cause the interposer 13 to follow deformation of the substrate 11 and the space transformer 14. As a result, it is possible to prevent a part of the wires from being cut by the deformation of any one of the substrate 11 and the space transformer 14. Moreover, in the interposer 13, the connection terminals 132 are only inserted in the housing 131. Therefore, when there is a defect in the connection terminal 132, only the connection terminal 132 can be replaced, enabling to perform maintenance easily and at low cost.

In the space transformer 14, as in the substrate 11, a wiring layer in the inside is three-dimensionally formed by via-holes and the like. The space transformer 14 has a regular octagonal surface substantially congruent with the interposer 13 and is formed in a thin plate shape with an insulating material such as ceramics as a base material, and also plays a function of reducing a difference between the coefficient of thermal expansion of the test object (semiconductor wafer) and the coefficient of thermal expansion of the substrate 11.

Figure 5:
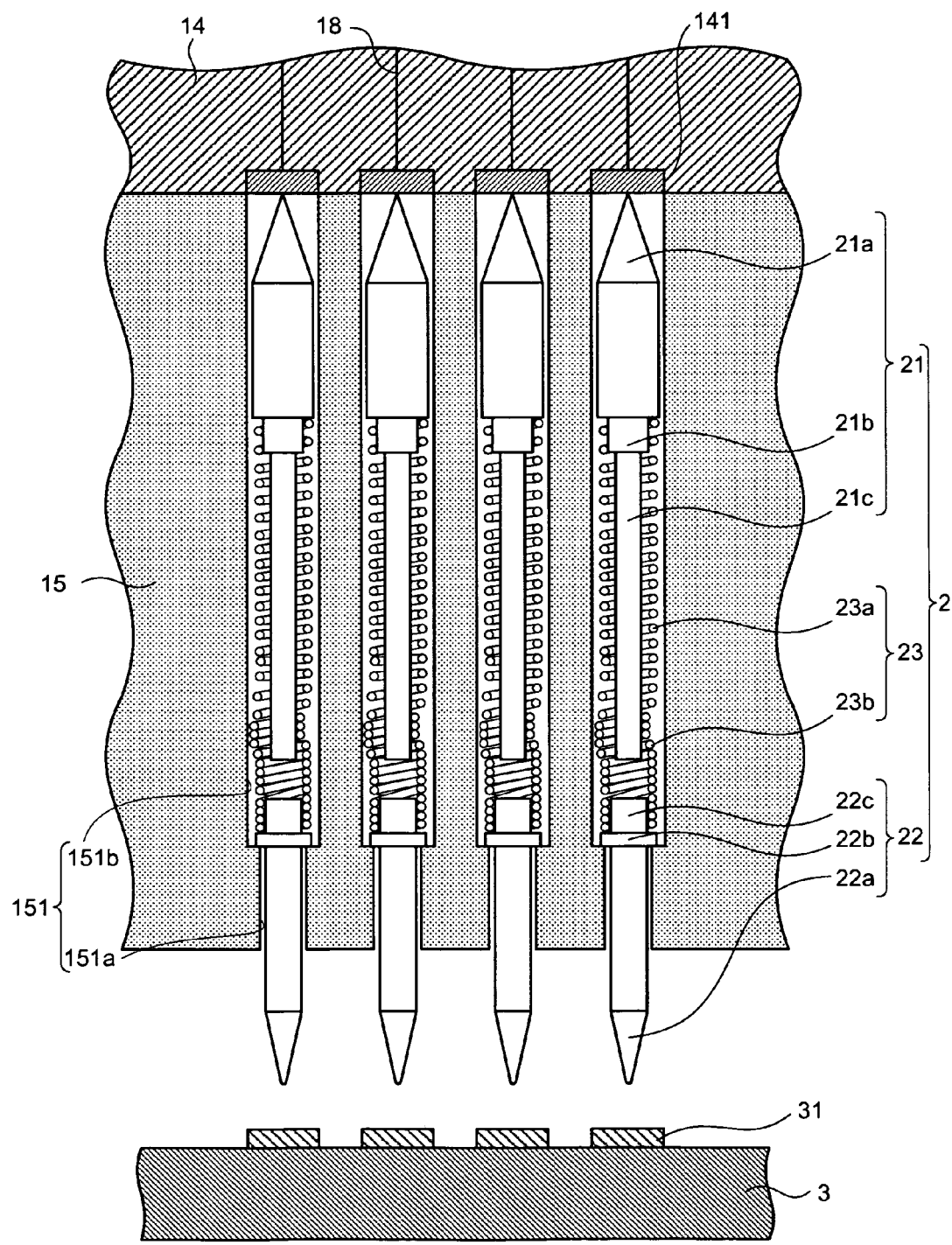
FIG. 5 is a partial cross sectional view of a structure of relevant parts of probes and a probe head.

FIG. 5 is a partial cross sectional view of a structure of a relevant part of the probe head 15 and a detailed structure of probes 2. FIG. 5 is turned upside down compared to FIG. 3 and FIG. 4 in order to describe the vertical direction when actually performing the test.

The probe 2 includes a needle-like member 21 that is in contact with the space transformer 14, a needle-like member 22 that projects in a direction opposed to the needle-like member 21 and comes into contact with an electrode pad 31 of a semiconductor wafer 3, and a spring member 23 that is provided between the needle-like member 21 and the needle-like member 22 and resiliently couples the two kinds of the needle-like members 21 and 22. The needle-like members 21 and 22 coupled to each other and the spring members 23 have an identical axis.

The needle-like member 21 includes a needle-like portion 21a that has a sharp tip projecting in a tip direction, a boss portion 21b that is provided at a base end portion on the opposite side of the sharp tip of the needle-like portion 21a and has a diameter smaller than a diameter of the needle-like portion 21a, and a shaft portion 21c that extends out from a surface on the opposite side of the side of the boss portion 21b in contact with the needle-like portion 21a. The needle-like member 21 is formed in a shape axially symmetrical in a longitudinal direction thereof. The needle-like member 22 includes a needle-like portion 22a that has a sharp tip projecting in a tip direction, a flange portion 22b that is provided at a base end portion on the opposite side of the sharp tip of the needle-like portion 22a and has a diameter larger than a diameter of the needle-like portion 22a, and a boss portion 22c that projects from a surface on the opposite side of the side of the flange portion 22b in contact with the needle-like portion 22a and has a diameter smaller than a diameter of the flange portion 22b. The needle-like member 22 is formed in a shape axially symmetrical in a longitudinal direction thereof.

The needle-like member 21 side of the spring member 23 is a loosely wound portion 23a and, on the other hand, the needle-like member 22 side thereof is a tightly wound portion 23b. The end portion of the loosely wound portion 23a is wound around the boss portion 21b of the needle-like member 21. The end portion of the tightly wound portion 23b is wound around the boss portion 22c of the needle-like member 22. The loosely wound portion 23a and the boss portion 21b are joined and the tightly wound portion 23b and the boss portion 22c are joined by any one of a spring winding force and soldering or both. At least a part of the tightly wound portion 23b is in contact with the shaft portion 21c of the needle-like member 21 in a state in which the needle-like member 21 is in contact with the electrode pad 141, i.e., a state shown in FIG. 5.

The probes 2 having the structure described above are arranged such that the tips of the needle-like portions 22a project corresponding to an arrangement pattern of the electrode pads 31 of the semiconductor wafer 3. The tip of the needle-like portion 22a comes into contact with the surface of the corresponding electrode pad 31 from a direction vertical to the surface. With this contact, the spring member 23 is further curved to meander. In this case, because a part of the tightly wound portion 23b maintains a state of contact with the shaft portion 21c of the needle-like member 21, a linear electric signal along the axial direction of the probe 2 flows to the tightly wound portion 23b. Therefore, an electric signal does not flow in a coil shape to the loosely wound portion 23a and an increase in the inductance of the probe 2 can be controlled.

Although not shown in FIG. 5, the probes 2 housed and held in the probe head 15 include a probe for a ground and a probe for electric power supply. Therefore, some of wires connected to the probe 2 are connected to a ground layer and a power supply layer.

The probe head 15 includes probe housing areas 15p that are formed by hole portions 151 for housing the probes 2 being pierced through the probe head 15 in a thickness direction (vertical direction in FIG. 5). The hole portion 151 includes a small diameter hole 151a having a length at least smaller than the length of the needle-like portion 22a in a longitudinal direction and a large diameter hole 151b that has a center axis the same as that of the small diameter hole 151a and has a diameter larger than that of the small diameter hole 151a. The inner diameter of the small diameter hole 151a is slightly larger than the outer diameter of the needle-like portion 22a of the needle-like member 22 and slightly smaller than the outer diameter of the flange portion 22b. Consequently, the small diameter hole 151a prevents the needle-like member 22 from coming off.

The number and an arrangement pattern of the probes 2 housed in the probe head 15 are determined depending on an arrangement pattern of the electrode pads 31 formed on the semiconductor wafer 3. For example, when the semiconductor wafer 3 having a diameter of 8 inches (about 200 millimeters) is a test object, hundreds to thousands of the probes 2 are necessary. When the semiconductor wafer 3 having a diameter of 12 inches (about 300 millimeters) is a test object, thousands to tens of thousands of the probes 2 are necessary. The probe head 15 is formed by using an insulative material such as ceramics.

The probe head 15 can be divided into two, i.e., upper and lower portions, along the vertical direction in FIG. 5. In this case, the two portions are coupled by using screws and positioning pins. To prevent a plate on a lower side from being expanded by an initial load of the probes 2, the thickness of the portion on the lower side is preferably set larger than the thickness of the portion on the upper side. By dividing the probe head 15 in this way, it is possible to easily replace the probes 2 in maintenance.

Figure 6:
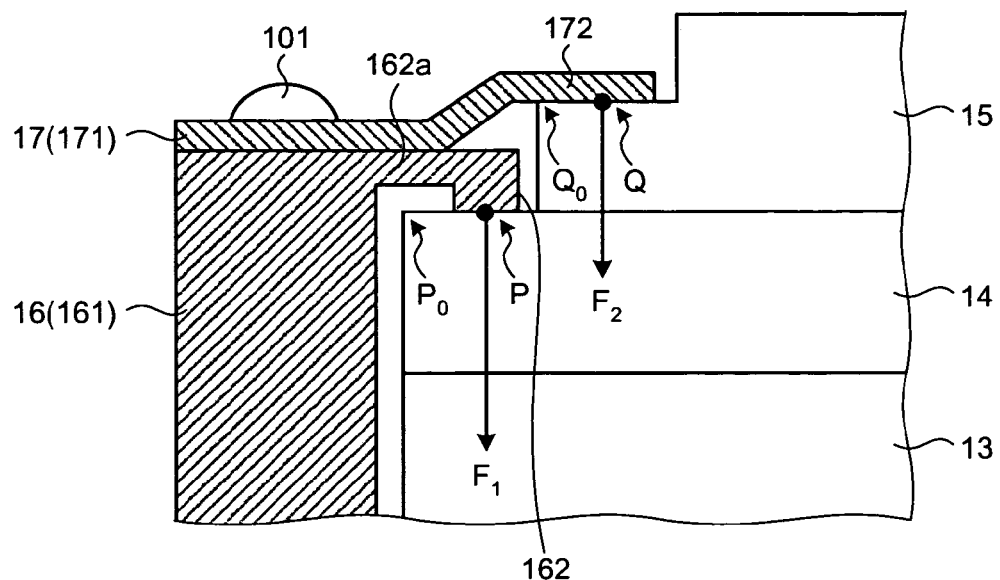
FIG. 6 is a partial cross sectional view of a structure of relevant parts of a retainer and a leaf spring included in the probe head according to the first embodiment of the present invention.

FIG. 6 is a partial cross sectional view of a structure of relevant parts of the retainer 16 and the leaf spring 17.

Figure 7:
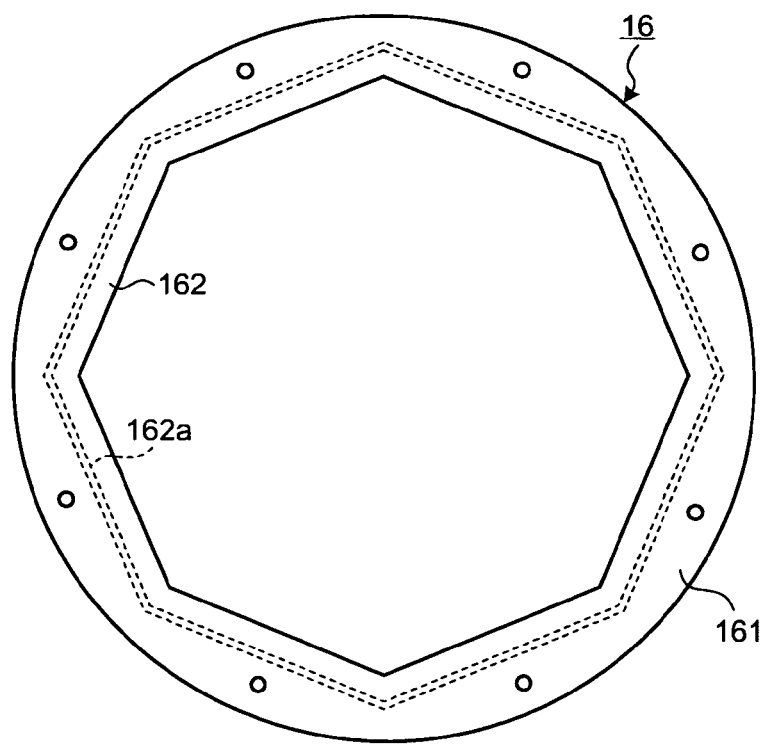
FIG. 7 is a plan view of a structure of the retainer.

The retainer 16 includes a main body 161 including a hollow portion of a regular octagonal prism shape in which the interposer 13 and the space transformer 14 can be stacked and held; and a contact portion 162 that extends in a belt shape over the entire circumference from the end at which the leaf spring 17 is stacked out of the ends of the main body 161 to the center direction of the hollow portion and is in contact with a portion of the space transformer 14 near the edge portion of the space transformer 14. FIG. 7 is a plan view of a structure of the retainer 16 and is a diagram viewed from a side on which the probe head 15 is stacked.

The contact portion 162 comes into surface contact with the surface of the space transformer 14 on the inside of the outer edge of the space transformer 14 and presses the space transformer 14 in a direction of the substrate 11. In the contact portion 162, a thin portion 162a that is thinner than other portions of the contact portion 162 is formed by cutting out the base end portion of the surface opposing the space transformer 14 in a groove shape.

The retainer 16 is realized by a material of high hardness such as alumite-finished aluminum, stainless steel, an invar material, a Kovar material (registered trademark), or duralumin in the similar manner to the reinforcing member 12.

The leaf spring 17 includes an annular thin outer peripheral portion 171 and pawl portions 172 that extend stepwise in an inner circumference direction from the outer peripheral portion 171 and press a portion of the probe head 15 near the edge of the probe head 15. As show in FIG. 1, the pawl portions 172 are uniformly provided over the entire outer peripheral portion 171 and are formed by performing bending processing on a portion extending in a tongue-like shape in the inner circumference direction from the outer peripheral portion 171. The leaf spring 17 is formed of a resilient material such as phosphor bronze, stainless steel (SUS), or beryllium copper. The pawl portions 172 of the leaf spring 17 are not limited to the case shown in FIG. 2. For example, a pitch angle θ between the adjacent pawl portions 172 can be changed, or a width w of the pawl portion 172 in the circumferential direction can be changed.

Figure 8:
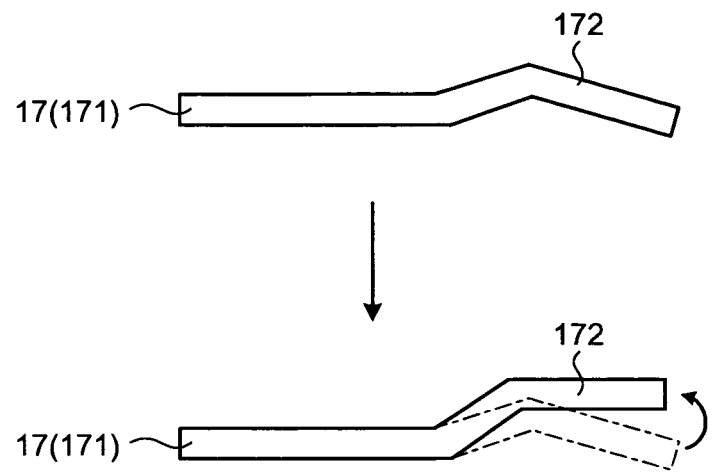
FIG. 8 is a schematic diagram illustrating a state of the leaf spring before use and during use.

FIG. 8 is a schematic diagram illustrating a state of the leaf spring 17 before use and during use. As shown in FIG. 8, the pawl portion 172 is applied with a load in advance in a direction in which the probe head 15 is pressed. In the state where the probe head 15 is attached, the surface of the pawl portion 172 near the tip becomes approximately parallel to the surface of the outer peripheral portion 171 and comes into surface contact with the probe head 15 near the edge portion of the probe head 15.

The retainer 16 and the leaf spring 17 having the above structures are fastened to the substrate 11 and the reinforcing member 12 by a screw member 101.

The retainer 16 and the leaf spring 17 form a holding member for holding at least the probe head 15 and the space transformer 14 by pressing each portion of the probe head 15 and the space transformer 14 near the edge portions thereof against the substrate 11.

The connectors 18 are arranged radially with respect to the center of the substrate 11 and form pairs with respective connectors provided on the testing device side. Terminals of the probes 2 and the testing device come into contact with each other to thereby establish electrical connection between the probes 2 and the testing device. As such connector, it is possible to apply a zero insertion force (ZIF) type connector.

Instead of realizing the connection between the probe card and the testing device with the connectors, it is also possible that terminals such as pogo pins having a spring action are provided in the testing device and the probe card is connected to the testing device via such terminals. In this case, connectors need not be provided to the probe card.

In the probe card 1 having the above structure, the thin portion 162a is provided at the base end portion of the contact portion 162 of the retainer 16, so that the retainer 16 does not come into contact with an end point $P_0$ at the outer edge of the space transformer 14 because the thin portion 162a functions as a clearance groove. Therefore, a point of application of force that the retainer 16 receives from the space transformer 14 is positioned inside of the outer edge of the space transformer 14. In other words, a point P of application of force that the space transformer 14 is pressed by the retainer 16 (reaction of a force that the retainer 16 receives from the space transformer 14) is positioned inside of the outer edge of the space transformer 14.

Consequently, the contact portion 162 is not rotationally supported at the end point $P_0$, so that warp of the contact portion 162 can be suppressed. Therefore, a force $F_1$ that the retainer 16 presses the space transformer 14 is oriented in a direction approximately parallel to the thickness direction of the space transformer 14, enabling to prevent warp of the space transformer 14 and the interposer 13.

Moreover, a point Q of application of force applied to the leaf spring 17 is positioned inside of an end point $Q_0$ at the outer edge of the probe head 15 in the probe card 1. Therefore, a force $F_2$ that the leaf spring 17 presses the probe head 15 in the direction of the substrate 11 is oriented in a direction approximately parallel to the thickness direction of the probe head 15, enabling to appropriately hold the probe head 15.

Therefore, even in the case of holding a large number of the probes 2 as in the full wafer level test, it is possible to suppress generation of deformation of the probe head 15 such as warp, so that the probe head 15 is excellent in durability, and a stable probe stroke can be obtained.

According to the first embodiment explained above, the point of application of force applied from the leaf spring to the probe head is positioned inside of the outer edge of the probe head and the point of application of force applied from the retainer to the space transformer is positioned inside of the outer edge of the space transformer, so that warp of the interposer, the space transformer, and the probe head can be suppressed. Thus, the flatness and the parallelism with respect to a predetermined reference surface can be accurately ensured.

Moreover, according to the first embodiment, a shear stress is dominant compared with a bend stress as a stress generated in the retainer and the lead spring, so that it is possible to increase a force that the retainer presses the space transformer and a force that the leaf spring presses the probe head.

In the first embodiment, any one of the retainer and the leaf spring can have a conventional structure. For example, when the retainer 16 is applied, a leaf spring having tongue-like pawl portions can be applied. When the leaf spring 17 is applied, a retainer with no thin portion in the contact portion can be applied.

Modification Example of First Embodiment

Figure 9:
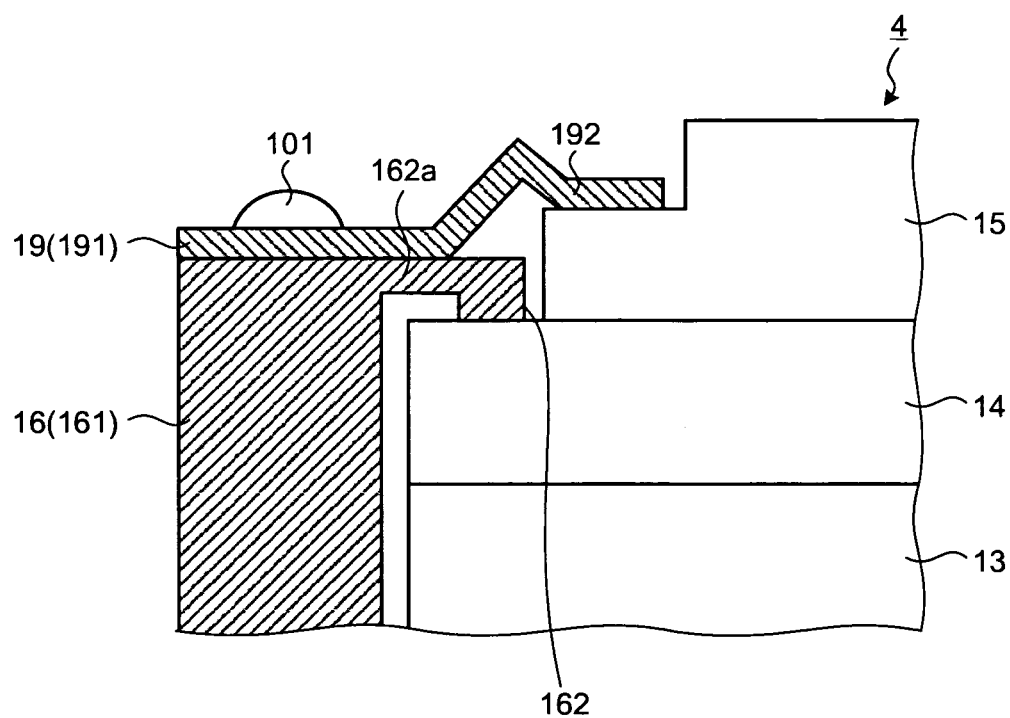
FIG. 9 is a partial cross sectional view of a structure of a relevant part of a probe card according to a modification example of the first embodiment of the present invention.

FIG. 9 is a partial cross sectional view of a structure of a relevant part of a probe card according to a modification example of the first embodiment. A probe card 4 shown in FIG. 9 is different from the first embodiment in the shape of the leaf spring.

A leaf spring 19 includes an annular thin outer peripheral portion 191 and pawl portions 192 that extend in the inner circumference direction from the outer peripheral portion 191. The pawl portion 192 has a V-shape in cross section with approximately a central portion of a portion extending from the outer peripheral portion 191 as an apex. A contact surface that is positioned on the inner circumference side of the apex and is in contact with the probe head 15 is approximately parallel to the surface of the outer peripheral portion 191 in the state where the probe head 15 is attached and has a level difference with respect to the outer peripheral portion 191. The pawl portion 192 is applied with a load in advance in a direction in which the probe head 15 is pressed in the similar manner to the pawl portion 172.

According to the probe card 4 having such structure, in the similar manner to the first embodiment, warp of the interposer, the space transformer, and the probe head can be suppressed. Thus, the flatness and the parallelism with respect to a predetermined reference surface can be accurately ensured.

Second Embodiment

Figure 10:
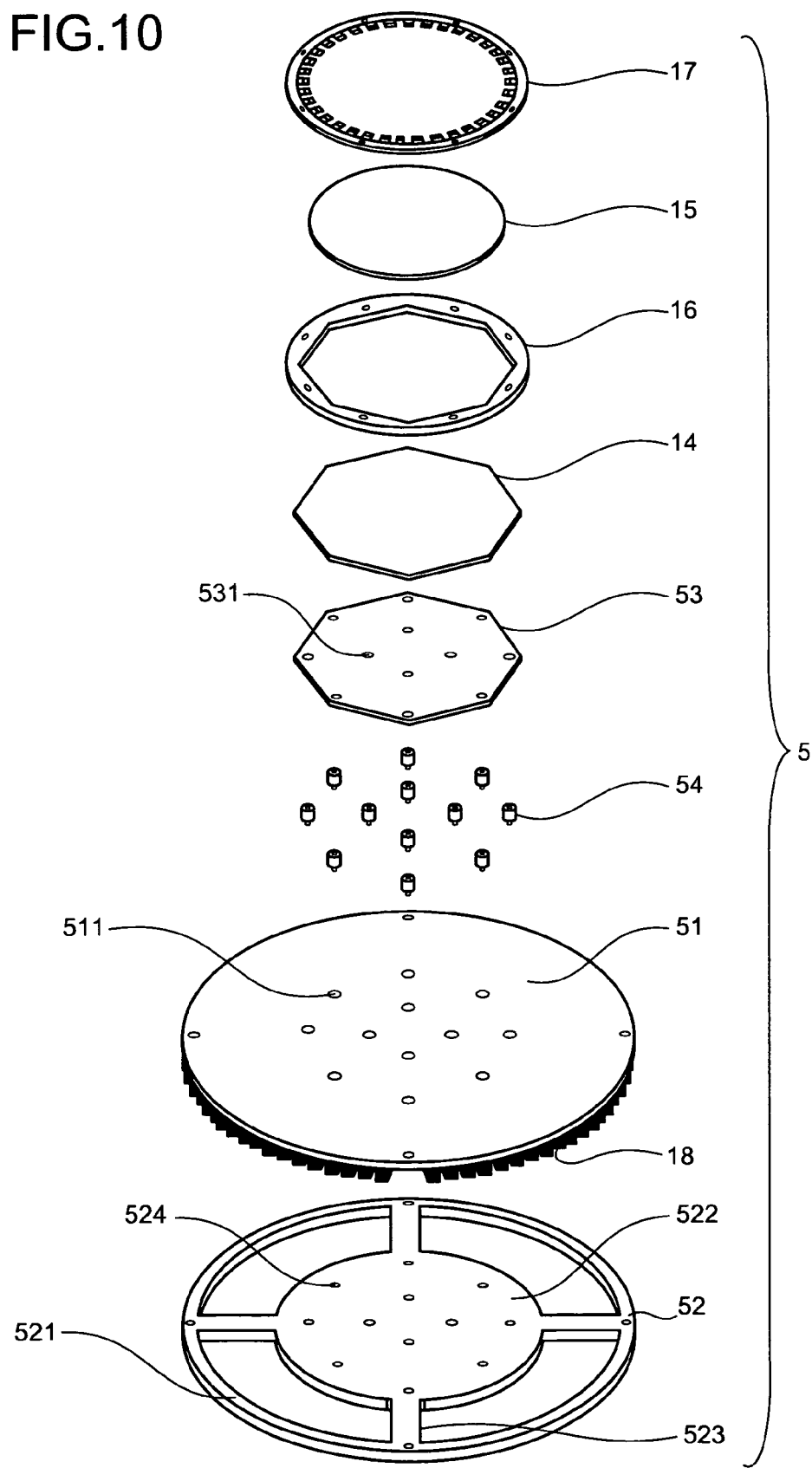
FIG. 10 is an exploded perspective view of a structure of a relevant part of a probe card according to a second embodiment of the present invention.
Figure 11:
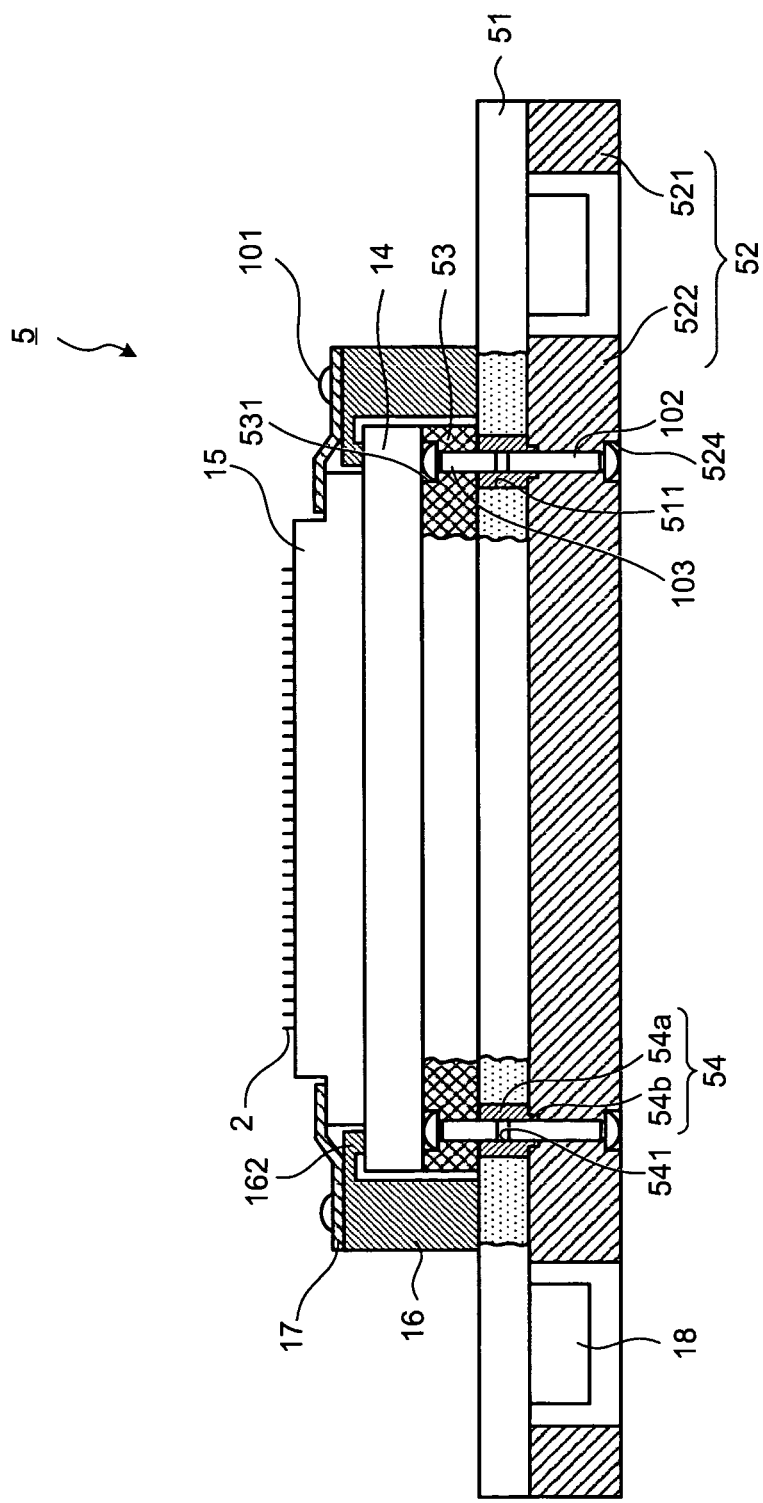
FIG. 11 is a partial cross sectional view of a structure of a relevant part of the probe card according to the second embodiment of the present invention.

FIG. 10 is an exploded perspective view of a structure of a relevant part of a probe card according to a second embodiment of the present invention. FIG. 11 is a partial cross sectional view of a structure of a relevant part of the probe card according to the second embodiment. A probe card 5 shown in FIGS. 10 and 11 has a structure in which a plurality of post members 54 is embedded in a plurality of hole portions 511 provided at predetermined positions in a substrate 51.

The post member 54 includes a hollow cylindrical large diameter portion 54a having a thickness slightly larger than a thickness of the substrate 51 and a small diameter portion 54b that has a smaller diameter than the large diameter portion 54a and a center axis same as the large diameter portion 54a. A hollow portion 541 is provided in the center axis direction (height direction) in the post member 54. The hollow portion 541 communicates with hole portions 524 and 531 formed in a reinforcing member 52 (including an outer peripheral portion 521, a central portion 522, and a coupling portion 523) and an interposer 53, respectively, and a thread into which screw members 102 and 103 can be screwed is formed on the inner surface of the hollow portion 541. The post member 54 can be made of a material same as the reinforcing member 52; however, stainless steel is particularly preferable in view of the need of high machining accuracy.

As shown in FIG. 10, the post members 54 are provided on two concentric circles having different diameters. The centers of these circles coincide with the center of the substrate 51. Four post members 54 are provided in a centrosymmetric manner on the circle having a smaller diameter, and eight post members 54 are provided in a centrosymmetric manner on the circle having a larger diameter. FIG. 11 is a cross sectional view showing a cut surface on which only the post members 54 provided on the circle having a larger diameter pass.

The end surface that is in contact with the interposer 53 out of the end surfaces of the post member 54 provided on the circle having a larger diameter is arranged at a position opposing the contact surface that the contact portion 162 of the retainer 16 is in contact with the space transformer 14 in the thickness direction (vertical direction in FIG. 11) of the space transformer 14. Therefore, the configuration is such that the contact portion 162 and the post members 54 sandwich the space transformer 14 and the interposer 53, so that it is possible to surely keep holding the interposer 53 and the space transformer 14 even if deformation such as waviness occurs in the substrate 51.

According to the second embodiment explained above, the point of application of force applied from the leaf spring to the probe head is positioned inside of the outer edge of the probe head, and the point of application of force applied from the retainer to the space transformer is positioned inside of the outer edge of the space transformer, so that warp of the interposer, the space transformer, and the probe head can be suppressed. Thus, the flatness and the parallelism with respect to a predetermined reference surface can be accurately ensured.

Moreover, according to the second embodiment, a plurality of post members is arranged to suppress deformation of the substrate, and part of the post members is positioned to oppose the contact portion of the retainer in the thickness direction of the probe card, so that the interposer and the space transformer can be surely held regardless of the presence or absence of the deformation of the substrate. Thus, accuracy in the flatness and the parallelism of the probe card with respect to a predetermined reference surface can be further improved.

In the second embodiment, any one of the retainer and the leaf spring can be a conventional one.

Third Embodiment

The third embodiment is characterized in that the configuration is such that the point of application of force applied to the holding unit is positioned inside of the outer edges of the probe head and the space transformer by chamfering the edge portions of the probe head and the space transformer.

Figure 12:
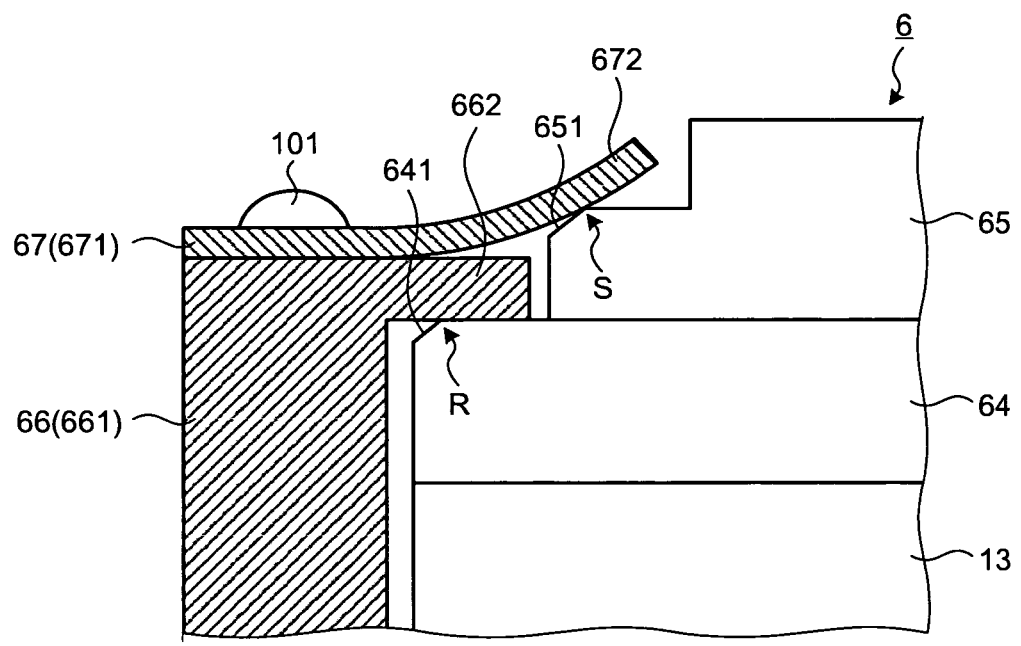
FIG. 12 is a partial cross sectional view of a structure of a relevant part of a probe card according to a third embodiment of the present invention.

FIG. 12 is a relevant part cross sectional view of a structure of a relevant part of a probe card according to the third embodiment. A probe card 6 shown in FIG. 12 includes a space transformer 64 and a probe head 65 whose respective edge portions are chamfered. The probe card 6 further includes a retainer 66 that includes a main body 661 and the contact portion 662 that extends in a belt shape over the entire circumference in the inner circumference direction from the main body 661 and a leaf spring 67 that includes an outer peripheral portion 671 and pawl portions 672 extending in a tongue-like shape from the outer peripheral portion 671. The configuration of the probe card 6 other than that shown in FIG. 12 is the same as the configuration of the probe card 1 according to the first embodiment.

The space transformer 64 includes a chambered portion 641 that is formed by C-chamfering the edge portion of the surface that opposes the retainer 66 and is in surface contact with the retainer 66. The probe head 65 includes a chamfered portion 651 that is formed by C-chamfering the edge portion of the surface that opposes and is in contact with the pawl portions 672 of the leaf spring 67.

In the probe card 6 having the above configuration, a point R of application of force that the retainer 66 applies to the space transformer 64 and a point S of application of force that the leaf spring 67 applies to the probe head 65 are positioned inside of the case where each edge portion of the space transformer 64 and the probe head 65 is not chamfered.

Therefore, according to the probe card in the third embodiment of the present invention, warp of the interposer, the space transformer, and the probe head can be suppressed in the similar manner to the above two embodiments. Thus, the flatness and the parallelism with respect to a predetermined reference surface can be accurately ensured.

In FIG. 12, the edge portion of the space transformer and the edge portion of the probe card are C-chamfered; however, they can be R-chamfered instead. Alternatively, the edge portion of only any one of the space transformer and the probe card can be chamfered.

Furthermore, in the third embodiment, the retainer 16, or the leaf spring 17 or 19 applied in the first embodiment can be applied.

Moreover, in the third embodiment, the configuration can be such that the post members 54 are embedded in the substrate in the similar manner to the second embodiment. In this case, at least part of the post members 54 is preferably arranged at a position opposing a contact portion 662 of the retainer 66 in the thickness direction of the space transformer 64.

Fourth Embodiment

Figure 13:
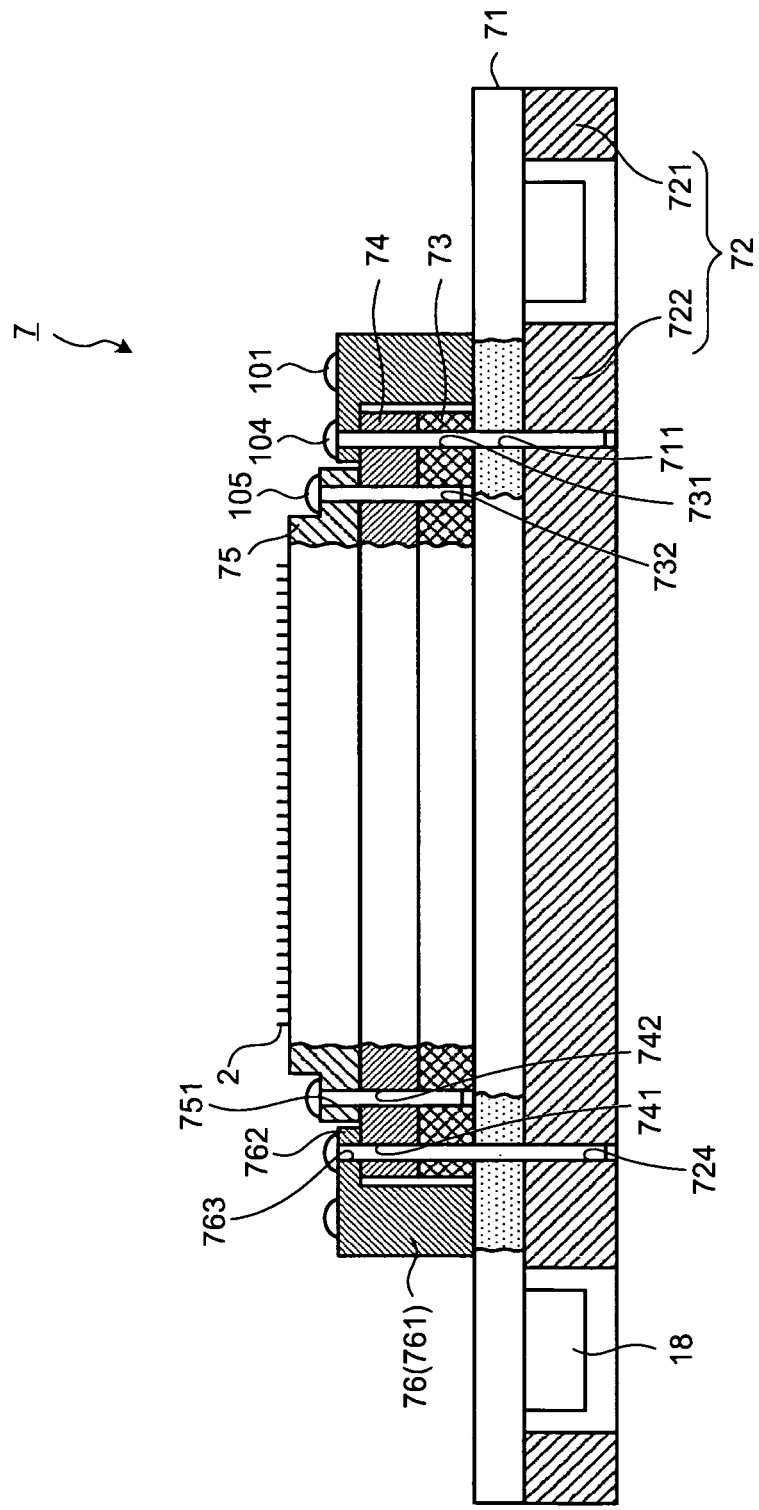
FIG. 13 is a partial cross sectional view of a structure of a relevant part of a probe card according to a fourth embodiment of the present invention.

FIG. 13 is a partial cross sectional view of a structure of a relevant part of a probe card according to a fourth embodiment of the present invention. A probe card 7 shown in FIG. 13 is characterized in that a space transformer 74 is pressed by a retainer 76 and screw members 104 in a direction of a substrate 71 and a probe head 75 is pressed by screw members 105 (second screw members) in the direction of the substrate 71.

The retainer 76 includes a main body 761 including a hollow portion in which an interposer 73 and the space transformer 74 are housed and a contact portion 762 that extends in a belt shape over the entire circumference in the inner circumference direction from the main body 761. Hole portions 763 that are pierced in the thickness direction are formed in the contact portion 762. The hole portion 763 communicates with hole portions 711, 724, 731, and 741 formed in the substrate 71, a reinforcing member 72 (including an outer peripheral portion 721 and a central portion 722), the interposer 73, and the space transformer 74, respectively. A thread is formed in the hole portions 763, 711, 724, 731, and 741, into which the screw member 104 is screwed. Therefore, the space transformer 74 is applied with a pressing force by the screw members 104 in the direction of the substrate 71. The point of application of this force is at the position of the hole portion 741. In other words, the point of application of the force applied to the space transformer 74 from the screw member 104 attached to the retainer 76 is positioned inside of the outer edge of the space transformer 74.

Hole portions 751 that are pierced in the thickness direction are formed in the probe head 75 near the edge portion of the probe head 75. The hole portion 751 communicates with the hole portions 732 and 742 formed in the interposer 73 and the space transformer 74, respectively. A thread is formed in the hole portions 751, 732, and 742, into which the screw member 105 is screwed. Therefore, the probe head 75 is applied with a pressing force by the screw members 105 in the direction of the substrate 71. The point of application of this force is at the position of the hole portion 751. In other words, the point of application of the force applied to the probe head 75 from the screw member 105 is positioned inside of the outer edge of the probe head 75.

As described above, in the fourth embodiment, the retainer 76 and the screw members 104 and 105 form at least part of the holding unit.

According to the fourth embodiment explained above, warp of the interposer, the space transformer, and the probe head can be suppressed in the similar manner to the first to third embodiments. Thus, the flatness and the parallelism with respect to a predetermined reference surface can be accurately ensured.

The probe head 75 can be pressed by using the leaf spring applied in any one of the first to third embodiments while pressing the space transformer 74 by the retainer 76 and the screw members 104. In this case, the screw member 105 is not needed.

Moreover, the space transformer 74 can be pressed by using the retainer applied in any one of the first to third embodiments while pressing the probe head 75 by the screw members 105. In this case, the screw member 104 is not needed.

Fifth Embodiment

Figure 14:
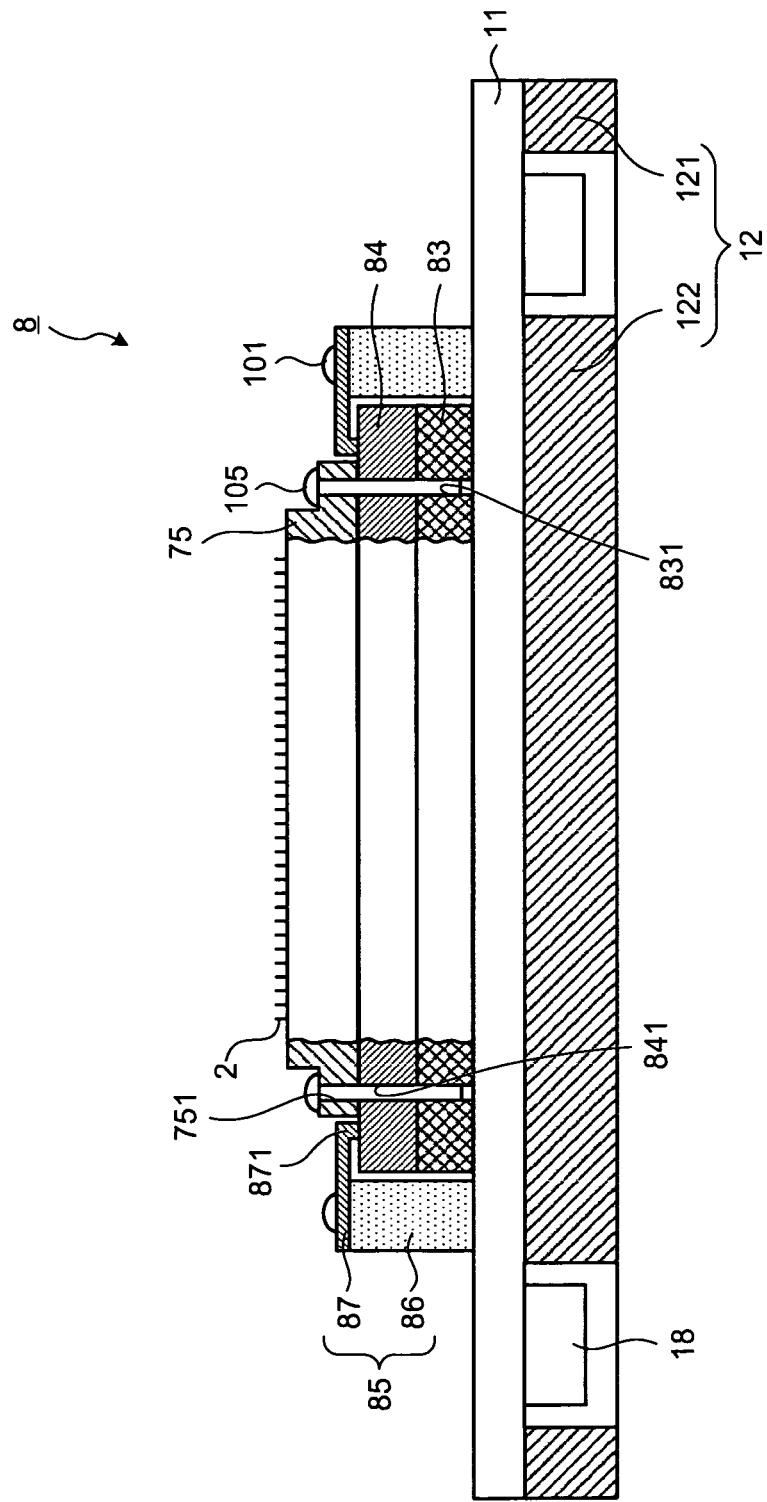
FIG. 14 is a partial cross sectional view of a structure of a relevant part of a probe card according to a fifth embodiment of the present invention.

FIG. 14 is a partial cross sectional view of a structure of a relevant part of a probe card according to a fifth embodiment of the present invention. A probe card 8 shown in FIG. 14 is characterized in that a space transformer 84 is pressed by a retainer 85 in the direction of the substrate 11 and the probe head 75 is pressed by the screw members 105 (second screw members) in the direction of the substrate 11.

The retainer 85 includes a main body 86 including a hollow portion in which an interposer 83 and the space transformer 84 are housed; and a ring member 87 that is attached to the end surface of the main body 86, has a ring shape extending in a belt shape in the inner circumference direction of the inner edge of the main body 86, and is in contact with the space transformer 84. The ring member 87 includes a contact portion 871 that projects in a direction perpendicular to the plane (horizontal plane in FIG. 14) formed by the ring and is in surface contact with the space transformer 84 on the inside of the outer edge of the space transformer 84 at the inner edge portion that extends in a belt shape. Therefore, the point of application of force that the retainer 85 applies to the space transformer 84 via the contact portion 871 is positioned inside of the outer edge of the space transformer 84.

The retainer 85 is fastened to the substrate 11 and the reinforcing member 12 (including the outer peripheral portion 121 and the central portion 122) by the screw members 101.

The hole portions 751 that are pierced in the thickness direction are formed in the probe head 75 near the edge portion of the probe head 75. The hole portion 751 communicates with hole portions 831 and 841 formed in the interposer 83 and the space transformer 84, respectively. A thread is formed in the hole portions 751, 732, and 742, into which the screw member 105 (second screw member) is screwed. Therefore, the probe head 75 is applied with a pressing force by the screw members 105 in the direction of the substrate 11. The point of application of this force is at the position of the hole portion 751. In other words, the point of application of the force applied to the probe head 75 from the screw member 105 is positioned inside of the outer edge of the probe head 75.

As described above, in the fifth embodiment, the retainer 85 and the screw members 105 form at least part of the holding unit.

According to the fifth embodiment explained above, warp of the interposer, the space transformer, and the probe head can be suppressed in the similar manner to the first to fourth embodiments. Thus, the flatness and the parallelism with respect to a predetermined reference surface can be accurately ensured.

In the fifth embodiment, the configuration can be such that the post members 54 are embedded in the substrate in the similar manner to the second embodiment. In this case, at least part of the post members 54 is preferably arranged at a position opposing the contact portion 871 of the ring member 87 in the thickness direction of the space transformer 84.

Moreover, the retainer 85 applied in the fifth embodiment can be applied as the retainer in the first to third embodiments.

Sixth Embodiment

Figure 15:
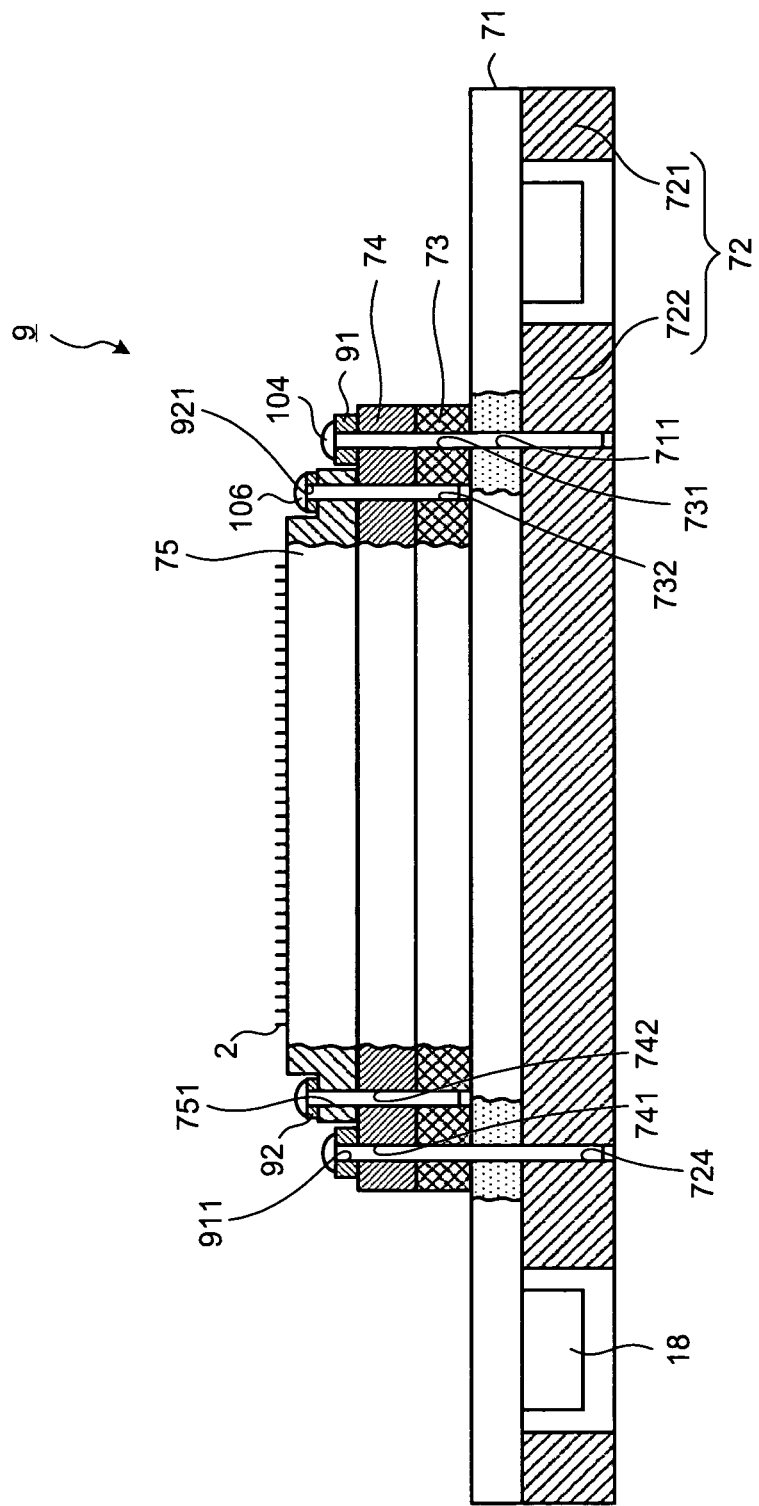
FIG. 15 is a partial cross sectional view of a structure of a relevant part of a probe card according to a sixth embodiment of the present invention.

FIG. 15 is a partial cross sectional view of a structure of a relevant part of a probe card according to a sixth embodiment of the present invention. A probe card 9 shown in FIG. 15 is characterized in that the space transformer 74 is pressed by the screw members 104 in the direction of the substrate 71 and the probe head 75 is pressed by screw members 106 (second screw members) in the direction of the substrate 71.

An annular ring member 91 for surely fastening the screw member 104 is interposed between the screw member 104 and the space transformer 74. The screw member 104 is screwed into the hole portions 911, 741, 731, 711, and 724 that are formed in the ring member 91, the space transformer 74, the interposer 73, the substrate 71, and the reinforcing member 72, respectively, and communicate with each other. Therefore, the space transformer 74 is applied with a pressing force by the screw members 104 in the direction of the substrate 71. The point of application of this force is at the position of the hole portion 741. In other words, the point of application of the force applied to the space transformer 74 from the screw member 104 is positioned inside of the outer edge of the space transformer 74.

An annular ring member 92 for surely fastening the screw member 106 is also interposed between the screw member 106 and the probe head 75. The screw member 106 is screwed into the hole portions 921, 751, 742, and 732 that are formed in the ring member 92, the probe head 75, the space transformer 74, and the interposer 73, respectively, and communicate with each other. Therefore, the probe head 75 is applied with a pressing force by the screw members 106 in the direction of the substrate 71. The point of application of this force is at the position of the hole portion 751. In other words, the point of application of the force applied to the probe head 75 from the screw member 106 is positioned inside of the outer edge of the probe head 75.

According to the sixth embodiment, warp of the interposer, the space transformer, and the probe head can be suppressed in the similar manner to the first to fifth embodiments. Thus, the flatness and the parallelism with respect to a predetermined reference surface can be accurately ensured.

Individual washers can be interposed between the respective screw members 104 and the space transformer 74 instead of using the ring members 91. Individual washers can be interposed between the respective screw members 106 and the probe head 75 instead of using the ring members 92.

Other Embodiments

The first to sixth embodiments are explained in detail as best modes for carrying out the present invention; however, the present invention should not be limited to the embodiments.

In the present invention, the shape of each of the probe head, the interposer, and the space transformer can be one other than the above described one. For example, the probe head can have a regular octagonal shape similar to the shape of each of the interposer and the space transformer described above. In the case, the leaf spring can also have a regular octagonal shape conforming to the probe head, and the pawl portions can be formed to uniformly press the entire circumference including at least respective apexes.

Moreover, in the present invention, the surface shape of each of the interposer and the space transformer can be a circle similar to the probe head. In this case, the probe card has the highest symmetry as a probe card for the full wafer level test and therefore is suitable in the case where the highest priority is given to the flatness and the parallelism of the probe card.

Furthermore, in the present invention, the surface of each of the interposer and the space transformer can have an appropriate regular polygon and the probe head can have a regular polygon similar to that of the interposer and the space transformer.

In addition, as the probes, any of various types of known probes can be applied.

The present invention can include various embodiments and the like not described in the specification, and various design changes and the like can be made in the range without departing from the technical idea as specified by the claims.

INDUSTRIAL APPLICABILITY

As described above, the probe card according to the present invention is useful for performing an electric characteristic test for a semiconductor and is particularly suitable for performing the full wafer level test.

The invention claimed is:

1. A probe card that electrically connects a semiconductor wafer as a test object and a circuit structure that generates a signal for a test, the probe card comprising:
    a plurality of probes that is made of a conductive material and comes into contact with the semiconductor wafer to receive or output an electric signal;
    a probe head that houses and holds the probes;
    a substrate that includes wires electrically connected to the circuit structure;
    a space transformer that transforms intervals between the wires of the substrate and causes the wires to come out to a surface of the space transformer on a side opposing the probe head; and
    a holding unit that is in direct contact with each of the probe head and the space transformer to directly press a portion near an edge portion of each of the probe head and the space transformer in a direction vertical to the substrate, wherein
    the probe head is closely stacked on the space transformer without a gap, and
    a point of application of force applied from the holding unit to the probe head is positioned inside of an outer edge of the probe head and/or a point of application of force applied from the holding unit to the space transformer is positioned inside of an outer edge of the space transformer so as to suppress warp of the probe head and the space transformer.

2. The probe card apparatus according to claim 1, wherein the holding unit includes a retainer that presses a portion near an edge portion of a surface of the space transformer in the direction of the substrate, and
    a point of application of force applied from the retainer to the space transformer is positioned inside of the outer edge of the space transformer.

3. The probe card apparatus according to claim 2, wherein the retainer includes
    a main body that includes a hollow portion in which the space transformer is housed, and
    a contact portion that extends in a belt shape in an inner circumference direction from an end surface of the main body and is in contact with the space transformer, and
    the contact portion is formed by cutting out a surface of a base end portion on a side on which the contact portion is in contact with the space transformer in a groove shape.

4. The probe card apparatus according to claim 3, further comprising a plurality of post members that is embedded to be pierced through the substrate from a surface of the substrate and has a height higher than a thickness of the substrate, wherein
    at least part of the post members is arranged at a position opposing the contact portion in a thickness direction of the space transformer.

5. The probe card apparatus according to claim 2, wherein the retainer includes
    a main body that includes a hollow portion in which the space transformer is housed, and
    a ring member that is attached to an end surface of the main body, has a ring shape extending in a belt shape in an inner circumference direction from an inner edge of the main body, and is in contact with the space transformer, wherein
    the ring member includes a contact portion at an inner edge portion extending in the belt shape, which projects in a direction perpendicular to a plane surface formed by the ring and is in contact with the space transformer on an inside of the outer edge of the space transformer.

6. The probe card apparatus according to claim 5, further comprising a plurality of post members that is embedded to be pierced through the substrate from a surface of the substrate and has a height higher than a thickness of the substrate, wherein
    at least part of the post members is arranged at a position opposing the contact portion in a thickness direction of the space transformer.

7. The probe card apparatus according to claim 2, wherein an edge portion of a surface opposing the retainer out of surfaces of the space transformer is chamfered.

8. The probe card apparatus according to claim 1, wherein
the holding unit includes a leaf spring that presses a portion near an edge portion of a surface of the probe head in the direction of the substrate, and
a point of application of force applied from the leaf spring to the probe head is positioned inside of the outer edge of the probe head.

9. The probe card apparatus according to claim 8, wherein an edge portion of a surface opposing the leaf spring out of surfaces of the probe head is chamfered.

10. The probe card apparatus according to claim 1, further comprising a reinforcing member that is mounted on the substrate and reinforces the substrate, wherein
the holding unit includes a screw member that fastens the space transformer, the substrate, and the reinforcing member.

11. The probe card apparatus according to claim 10, wherein
the holding unit further includes a retainer that presses a portion near an edge portion of a surface of the space transformer in the direction of the substrate, and
the screw member fastens the retainer together with the space transformer, the substrate, and the reinforcing member.

12. The probe card apparatus according to claim 1, wherein the holding unit includes a second screw member that fastens the probe head and the space transformer.

13. The probe card apparatus according to claim 1, further comprising an interposer that is stacked between the substrate and the space transformer and connects the wires of the substrate.

* * * * *